United States Patent
Yang et al.

(10) Patent No.: US 10,698,018 B2
(45) Date of Patent: Jun. 30, 2020

(54) NOISE DETECTION CIRCUIT CAPABLE OF RECOGNIZING NOISE EVENT OCCURRING IN DEVICE UNDER TEST, AND RELATED SYSTEM AND METHOD FOR TESTING DEVICE UNDER TEST

(71) Applicant: TAIWAN SEMICONDUCTOR MANUFACTURING COMPANY LTD., Hsinchu (TW)

(72) Inventors: Chung-Chieh Yang, Hsinchu County (TW); Tse-Hung Chen, Taipei (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 80 days.

(21) Appl. No.: 16/034,797

(22) Filed: Jul. 13, 2018

(65) Prior Publication Data

US 2020/0018784 A1    Jan. 16, 2020

(51) Int. Cl.
*G01R 29/26* (2006.01)

(52) U.S. Cl.
CPC ................... *G01R 29/26* (2013.01)

(58) Field of Classification Search
None
See application file for complete search history.

(56) References Cited

U.S. PATENT DOCUMENTS

2011/0231128 A1* 9/2011 Suda ............... G01R 31/31709
702/75

* cited by examiner

*Primary Examiner* — Jas A Sanghera
(74) *Attorney, Agent, or Firm* — WPAT, P.C., Intellectual Property Attorneys; Anthony King

(57) ABSTRACT

A noise detection circuit includes an analog-to-digital conversion (ADC) circuit and a noise event recognition circuit. The ADC circuit is configured to convert an analog signal outputted from a device under test (DUT) into a sequence of digital codes. The noise event recognition circuit, coupled to the ADC circuit, is configured to determine a noise count of the sequence of digital codes, and refer to the noise count to determine if a noise event occurs in the DUT. The noise count indicates a number of times a change in code values between two successive digital codes exceeds a predetermined value.

20 Claims, 10 Drawing Sheets

NOISE DETECTION CIRCUIT CAPABLE OF RECOGNIZING NOISE EVENT OCCURRING IN DEVICE UNDER TEST, AND RELATED SYSTEM AND METHOD FOR TESTING DEVICE UNDER TEST

BACKGROUND

The present disclosure relates to noise detection and, more particularly, to a noise detection circuit capable of recognizing a noise event occurring in a device under test (DUT), and a system and method for testing a DUT.

Random telegraph noise (RTN) is a type of electronic noise that is caused by stochastic trapping/detrapping behavior of channel carriers in gate dielectrics. As the amplitude of RTN increases with aggressive scaling of feature sizes, RTN will cause the drain current to fluctuate randomly between several discrete levels within a wide range of timescale when a scaled metal-oxide-semiconductor field-effect transistor (MOSFET) operates in a sub-threshold region. Thus, RTN is considered to be a prominent source of threshold voltage fluctuation in scaled MOSFETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
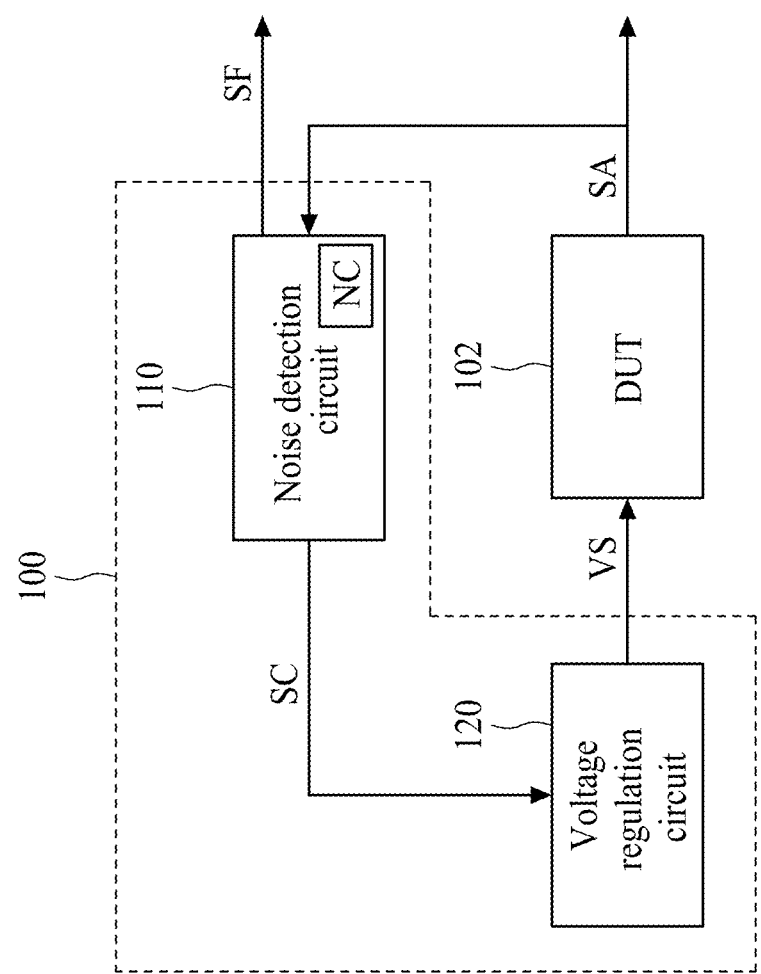
FIG. 1 is a diagram illustrating an exemplary system for testing one or more devices under test in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

In the below description, a signal is asserted with a logical high value to activate a corresponding device when the device is active high. In contrast, the signal is deasserted with a low logical value to deactivate the corresponding device. When the device is active low, however, the signal is asserted with a low logical value to activate the device, and is deasserted with a high logical value to deactivate the device.

While scaled transistor devices bring benefits including reduced power consumption and high-density integration, a little variation of device parameters thereof can cause reliability degradation and hence yield loss. For example, the threshold voltage shift can significantly affect yield and performance of large-scale integrated circuits. In order to confirm whether performance of an integrated circuit, or a semiconductor intellectual property (IP), is affected by RTN, one strategy is to connect a test bench to the integrated circuit for RTN diagnosis. However, the test bench fails to reduce the yield loss since a device under test (DUT) where RTN induced failures are detected would be discarded. In addition, customers are still unable to perform RTN diagnosis to check product reliability at the customer end.

The present disclosure describes exemplary noise detection circuits capable of recognizing a noise event, such as an RTN event, occurring in DUTs. The exemplary noise detection circuits can be a built-in self-test (BIST) circuit disposed on a die including one or more DUTs. Hence, noise event recognition results can be obtained at the customer end in real time. The present disclosure further describes exemplary systems and methods for testing one or more DUTs. Similarly, the exemplary systems and methods can utilize BIST mechanisms to rapidly identify whether an RTN event occurs. In some embodiments, the exemplary systems and methods can provide a BIST loop, which can refer to noise event recognition results to control supply power(s) of the one or more DUTs to thereby improve yield and circuit performance of the one or more DUTs. Further description is provided below.

FIG. 1 is a diagram illustrating an exemplary system for testing one or more DUTs in accordance with some embodiments of the present disclosure. Although a single DUT 102 is shown in FIG. 1, those skilled in the art will recognize that the system 100 can be used to test one or more DUTs without departing from the scope of the present disclosure. In the present embodiment, the system 100 is configured to provide a supply power such as a supply voltage VS for the DUT 102, which outputs an output signal SA according to the supply voltage VS. The DUT 102 can be a transistor device, a voltage reference generator circuit, an oscillator or other types of devices to be tested. The output signal SA can be an analog signal or a digital signal depending on a type of the DUT 102.

Additionally, the system 100 is configured to monitor variations in the output signal SA to determine whether a noise event, e.g. an RTN event, occurs in the DUT 102. The monitored variations in the output signal SA may be, but is not limited to, at least one of voltage, current, frequency and pulse width variations. In some embodiments, when it is determined that the noise event occurs, the system 100 may adjust the supply voltage VS to stabilize the output signal SA.

In the present embodiment, the system 100 may include, but is not limited to, a noise detection circuit 110 and a voltage regulation circuit 120. The noise detection circuit 110 is configured to determine, in real time or substantially real time, whether the noise event occurs in the DUT 102 by monitoring the variations in the output signal SA. In some embodiments, the noise detection circuit 110 is configured to sample the output signal SA to generate a sequence of sample values of the output signal SA, and determine a noise count NC of the sequence of sample values. The noise count NC can indicate a number of times a difference, or an amount of change, between two successive sample values exceeds a predetermined value. As the output signal SA may intensely fluctuates between several levels when the noise event occurs in the DUT 102, the noise count NC may be used as a noise event indicator.

In some embodiments, the more intensely the output signal SA fluctuates, the more likely a difference between two successive sample values exceeds the predetermined value, and the larger the noise count NC can be. In these embodiments, when the noise count NC is greater than or equal to a predetermined threshold, implying that the output signal SA is unstable due to the noise event, the noise detection circuit 110 may determine that the noise event occurs in the DUT 102. When the noise count NC is less than the predetermined threshold, the noise detection circuit 110 may determine that no noise event occurs since the output signal SA has small variations.

Additionally, the noise detection circuit 110 may be configured to generate a flag signal SF indicating whether the noise event occurs in the DUT 102. When it is determined that no noise event occurs, the noise detection circuit 110 is configured to output the flag signal SF indicating a "PASS" status, representing that no noise event is detected and the DUT 102 meets the product specifications. When it is determined that the noise event occurs, the noise detection circuit 110 is configured to output the flag signal SF indicating a "FAIL" status, representing that the noise event occurs such that the DUT 102 fails to meet the product specifications. In some embodiments, the noise detection circuit 110 may set the flag signal SF to a first signal level to indicate the "PASS" status, and set the flag signal SF to a second signal level, different from the first signal level, to indicate the "FAIL" status and the occurrence of the noise event.

Since the noise count NC can quickly reflect the variations in the output signal SA, the noise detection circuit 110 can rapidly identify whether the DUT 102 is affected by the noise event. It is worth noting that, in some embodiments, the noise detection circuit 110 and the DUT 102 can be disposed on a same die (not shown in FIG. 1). As a result, the noise detection circuit 110 can be a BIST circuit disposed on a die where one or more DUTs are disposed. In these embodiments, the noise detection circuit 110 can be a BIST circuit for rapid detection and identification of a noise event such as an RTN event.

In the present embodiment, the noise detection circuit 110 can be further configured to generate a control signal SC according to the noise count NC. The voltage regulation circuit 120, coupled to the noise detection circuit 110, can be configured to selectively adjust the supply voltage VS according to the control signal SC. In some embodiments, the voltage regulation circuit 120 may be a low drop-out (LDO) regulator. However, those skilled in the art will appreciate that the voltage regulation circuit 110 may be other types of voltage regulators or power supply circuits without departing from the scope of the present disclosure.

As the noise detection circuit 110 can provide the control signal SC for the voltage regulation circuit 120 according to the noise count NC, the voltage regulation circuit 120 can dynamically adjust the supply voltage VS in response to a change in the noise count NC. In some embodiments, when the noise count NC is greater than or equal to a predetermined threshold, the voltage regulation circuit 120 is configured to adjust the supply voltage VS according to the control signal SC to thereby stabilize the output signal SA. By way of example but not limitation, the voltage regulation circuit 120 may provide the supply voltage VS of a preset voltage level such as 0.4 volt for each DUT tested by the system 100. When the noise count NC is less than the predetermined threshold, the noise detection circuit 110 may output the flag signal SF indicating the "PASS" status, representing that the DUT 102 operating at the preset voltage level can pass the product specifications. When the noise count NC is greater than or equal to the predetermined threshold, the noise detection circuit 110 may determine that the noise event occurs, and output the flag signal SF indicating the "FAIL" status. This means that the supply voltage VS of the preset voltage level is insufficient to make the DUT 102 pass the product specifications. The noise detection circuit 110 may refer to the noise count NC to increase the supply voltage VS from the preset voltage level to a tuned voltage level, e.g. from 0.4 to 0.42 volt, thereby making the DUT 102 pass the product specifications.

Since the voltage regulation circuit 120 can tune the supply voltage VS according to the noise count NC, the supply voltage VS can be customized for each DUT to pass the production specifications. As a result, with the feedback loop formed by the noise detection circuit 110, the system 100 can improve the production yield.

Figure 2:
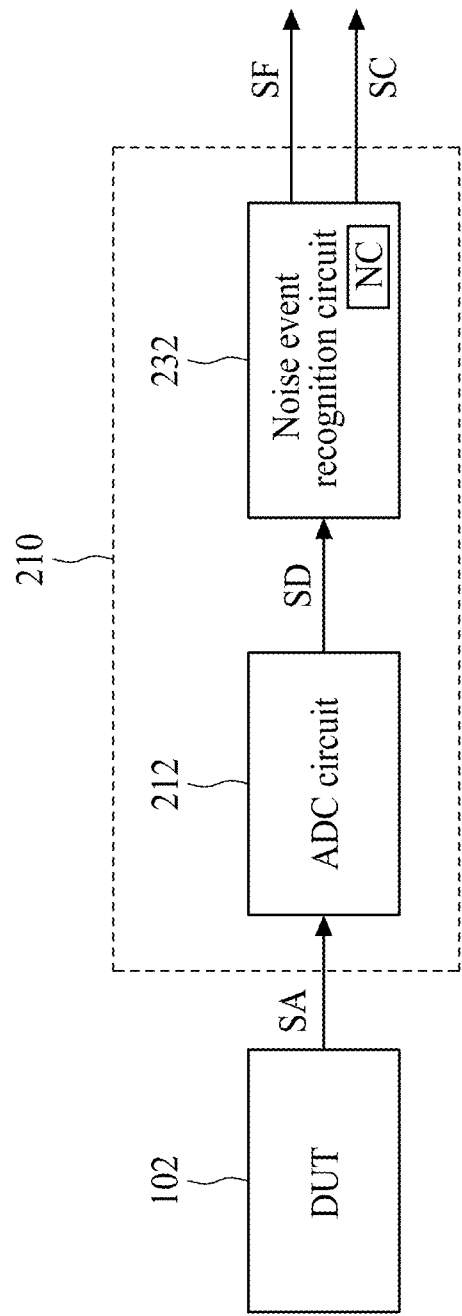
FIG. 2 is a block diagram of an embodiment of the noise detection circuit shown in FIG. 1 in accordance with some embodiments of the present disclosure.

In some embodiments where the output signal SA is an analog signal, the noise detection circuit 110 may be configured to perform analog-to-digital conversion (ADC) on the analog signal, and detect if a noise event occurs according to the conversion result. Referring to FIG. 2, a block diagram of an embodiment of the noise detection circuit 110 shown in FIG. 1 in accordance with some embodiments of the present disclosure is illustrated. The noise detection circuit 210 can be configured to detect the occurrence of a noise event, such as an RTN event, according to the output signal SA generated from the DUT 102 shown in FIG. 1. The output signal SA is an analog signal in the present embodiment. The noise detection circuit 210 may include, but is not limited to, an analog-to-digital conversion (ADC) circuit 212 and a noise event recognition circuit 232. The ADC circuit 212 is configured to convert the output signal SA into a sequence of digital codes SD, i.e. a digital signal. For example, the ADC circuit 212 can be configured to sample the output signal SA at different times to obtain a sequence of sample values, which corresponds to code values of the sequence of the digital codes SD. In some embodiments, the ADC circuit 212 may adopt various conversion schemes such as direct-conversion ADC, successive-approximation ADC, ramp-compare ADC, integrating ADC, counter-ramp ADC, pipeline ADC, sigma-delta ADC, time interleaved ADC and intermediate FM stage ADC.

The noise event recognition circuit 232, coupled to the ADC circuit 212, is configured to determine a noise count NC of the sequence of digital codes SD, and refer to the noise count NC to determine if the noise event occurs in the DUT 102 shown in FIG. 1. The noise count NC can indicate a number of times a change in code values between two successive digital codes exceeds a predetermined value, or a number of times an amount of change between two successive code values exceeds the predetermined value. In some embodiments, when the noise count NC is greater than or equal to a predetermined threshold, the noise event recognition circuit 232 can be configured to generate the flag signal SF indicating that the noise event occurs. In some embodiments, when the noise count NC is less than the predetermined threshold, the noise event recognition circuit 232 may generate the flag signal SF indicating that no noise event is detected. By way of example but not limitation, the noise event recognition circuit 232 may set the flag signal SF to a signal level to indicate the "PASS" status when no noise event is detected, and set the flag signal SF to another signal level to indicate the "FAIL" status when the noise event occurs.

In some embodiments, the noise event recognition circuit 232 is further configured to generate the control signal SC according to the noise count NC, such that the voltage regulation circuit 120 shown in FIG. 1 can adjust a supply power in response to the occurrence of the noise event.

Figure 3:
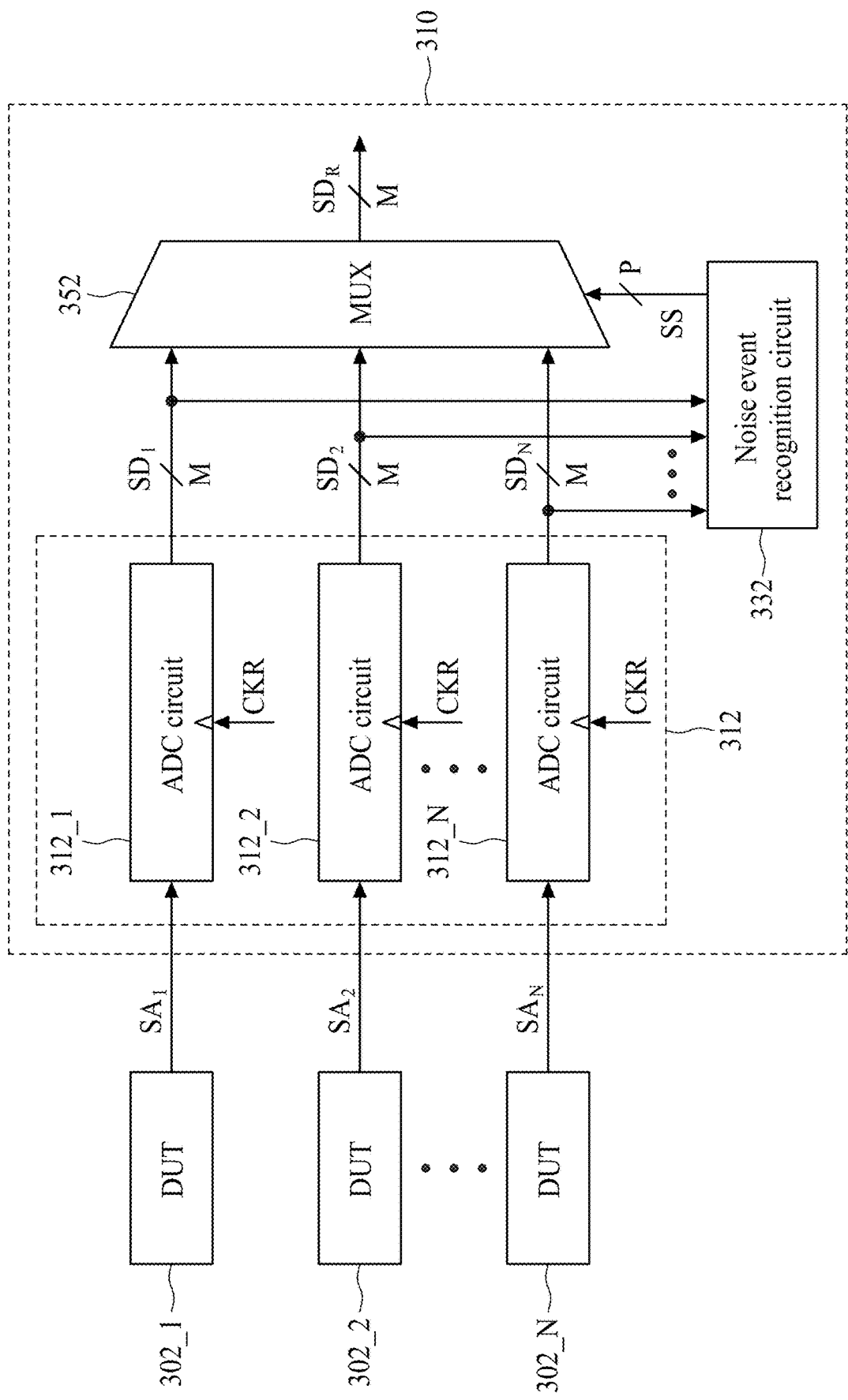
FIG. 3 shows a block diagram of another embodiment of the noise detection circuit shown in FIG. 1 in accordance with some embodiments of the present disclosure.

FIG. 3 shows a block diagram of another embodiment of the noise detection circuit 110 shown in FIG. 1 in accordance with some embodiments of the present disclosure. Similar to the embodiment shown in FIG. 2, respective output signals $SA_1$-$SA_N$ generate by one or more DUTs 302_1-302_N are analog signals in the present embodiment, where N is a positive integer. The DUTs 302_1-302_N may be disposed on a same die and arranged in an array pattern. For illustrative purposes, in the embodiment shown in FIG. 3, each DUT detected by the noise detection circuit 310 is implemented as an oscillator generating a clock signal, i.e. one of the output signals $SA_1$-$SA_N$. However, those skilled in the art will recognize that the noise detection circuit 310 can be configured to detect other types of DUTs without departing from the scope of the present disclosure.

The noise detection circuit 310 may include, but is not limited, an ADC stage 312, a noise event recognition circuit 332 and a multiplexer 352 labeled MUX. The ADC stage 312 includes one or more ADC circuits 312_1-312_N, respectively coupled to the DUTs 302_1-302_N. Each ADC circuit can represent an embodiment of the ADC circuit 212 shown in FIG. 2. Additionally or alternatively, the noise event recognition circuit 332 can be an embodiment of the noise event recognition circuit 232 shown in FIG. 2.

In the present embodiment, each ADC circuit is configured to convert an analog signal, i.e. one of the output signals $SA_1$-$SA_N$, into a sequence of digital codes, i.e. one of a plurality of sequences of digital codes $SD_1$-$SD_N$. Each digital code in the sequence of digital codes may be an M-bit digital code, where M is a positive integer greater than one. Additionally, at least one of the ADC circuits 312_1-312_N circuit may generate the sequence of digital codes by counting a cycle time of the output signal based on a reference clock signal CKR. As a result, the sequence of digital codes can indicate cycle time information, or frequency information, of the output signal of the corresponding DUT. By way of example but not limitation, each ADC circuit can be configured to receive the reference clock signal CKR, and count a number of cycles of the reference clock signal CKR generated during each cycle of the output signal to generate the sequence of digital codes. More details will be provided later.

The noise event recognition circuit 332, coupled to the ADC circuits 312_1-312_N, is configured to determine a noise count of a sequence of digital codes produced by each ADC circuit, and refer to the noise count to determine if a noise event occurs in a corresponding DUT. The noise count indicates a number of times a change in code values between two successive digital codes exceeds a predetermined value. For example, the noise event recognition circuit 332 may determine if a noise event occurs in the DUT 302_1 by determining a noise count of the sequence of digital codes $SD_1$ produced by the ADC circuit 312_1 coupled to the DUT 302_1. It is worth noting that, by concurrently determining respective noise counts of the sequences of digital codes $SD_1$-$SD_N$, the noise event recognition circuit 332 is capable of detecting the DUTs 302_1-302_N in a parallel manner to save test time. However, those skilled in the art should appreciate that detecting the DUTs 302_1-302_N in sequence also falls within the scope of the present disclosure.

When determining that a DUT is affected by a noise event, the noise event recognition circuit 332 can be further configured to generate a selection signal SS indicative of the affected DUT. Hence, the multiplexer 352 can be configured to, in response to the selection signal SS, select a digital signal affected by the noise event as an output signal $SD_R$. By way of example but not limitation, the selection signal SS may be a P-bit digital signal, wherein $2^P$ equals N such that the selection signal SS can indicate N devices under test, i.e. the DUTs 302_1-302_N.

Figure 4:
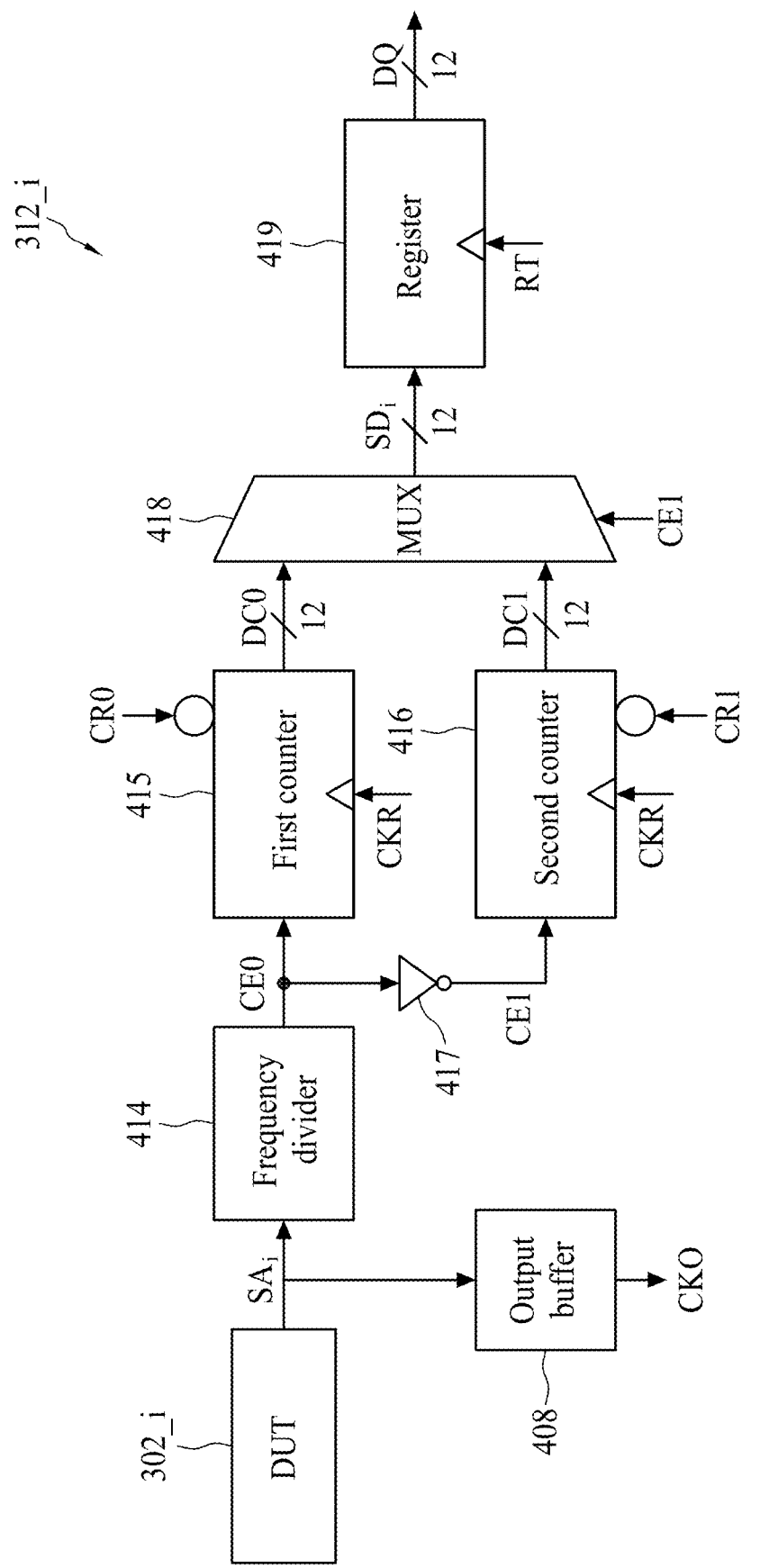
FIG. 4 shows a block diagram of an embodiment of the analog-to-digital conversion circuit shown in FIG. 3 in accordance with some embodiments of the present disclosure.

As described above, at least one ADC circuit in the ADC stage 312 may convert each cycle time of an output signal of a corresponding DUT into a sequence of digital codes. FIG. 4 shows a block diagram of an embodiment of the ADC circuit 312_i (1≤i≤N) shown in FIG. 3 in accordance with some embodiments of the present disclosure. In the present embodiment, the output signal $SA_i$ of the DUT 302_i is sent to the ADC circuit 312_i for noise event detection, and is also sent to an output buffer 408 for other tests. The ADC circuit 312_i may utilize a plurality of time-interleaved counters for continuously counting a cycle time of the output signal $SA_i$ of the DUT 302_i, thereby generating the sequence of digital codes $SD_i$. The output buffer 408 is configured to buffer the output signal SA to generate a buffered signal CKO.

The ADC circuit 312_i may include, but is not limited to, a frequency divider 414, a first counter 415, a second counter 416, an inverter 417, a multiplexer 418 and a register 419. The frequency divider 414 is configured to perform frequency division upon the output signal $SA_i$ to generate a frequency-divided signal CE0. The first counter 415, coupled to the frequency divider 414, is configured to count a number of cycles of the reference clock signal CKR generated during a first portion of each cycle of the frequency-divided signal CE0 to generate a first digital count DC0. The second counter 416, coupled to the frequency divider 414, is configured to count a number of cycles of the reference clock signal CKR generated during a second portion of each cycle of the frequency-divided signal CE0 to generate a second digital count DC1.

The inverter 417 is configured to invert the frequency-divided signal CE0 to generate an inverted frequency-divided signal CE1. As each of the first counter 415 and the second counter 416 may be enabled by a trigger signal having a predetermined logic level such as a logic high level, the frequency-divided signal CE0 and the inverted frequency-divided signal CE1 can be used as trigger signals for enabling the first counter 415 and the second counter 416 respectively, thus allowing the first counter 415 and the second counter 416 to operate in a time-interleaved manner.

The multiplexer 418, coupled to the first counter 415 and the second counter 416, is configured to select one of the first digital count DC0 and the second digital count DC1 in response to the frequency-divided signal CE0, and accordingly provide the sequence of digital codes $SD_i$. By way of example but not limitation, when the first counter 415 is enabled by the frequency-divided signal CE0 having a high signal level, the multiplexer 418 is configured to select the first digital count DC0 to provide the sequence of digital codes $SD_i$; when the first counter 415 is disabled due to the frequency-divided signal CE0 having a low signal level, the multiplexer 418 is configured to select the second digital count DC1 to provide the sequence of digital codes $SD_i$ since the second counter 416 is enabled. In the present embodiment, as the inverted frequency-divided signal CE1 has a signal level inverted with respect to that of the frequency-divided signal CE0, the multiplexer 418 can be configured to receive the inverted frequency-divided signal CE1 to perform multiplexing. However, those skilled in the art should appreciate that the multiplexer 418 can receive the frequency-divided signal CE0 to perform multiplexing without departing from the scope of the present disclosure.

The register 419 is configured to store the sequence of digital codes $SD_i$ outputted from the multiplexer 418. Also, the register 419 is configured to output the sequence of digital codes $SD_i$, provided by the multiplexer 418, in response to a register trigger signal RT.

Figure 5:
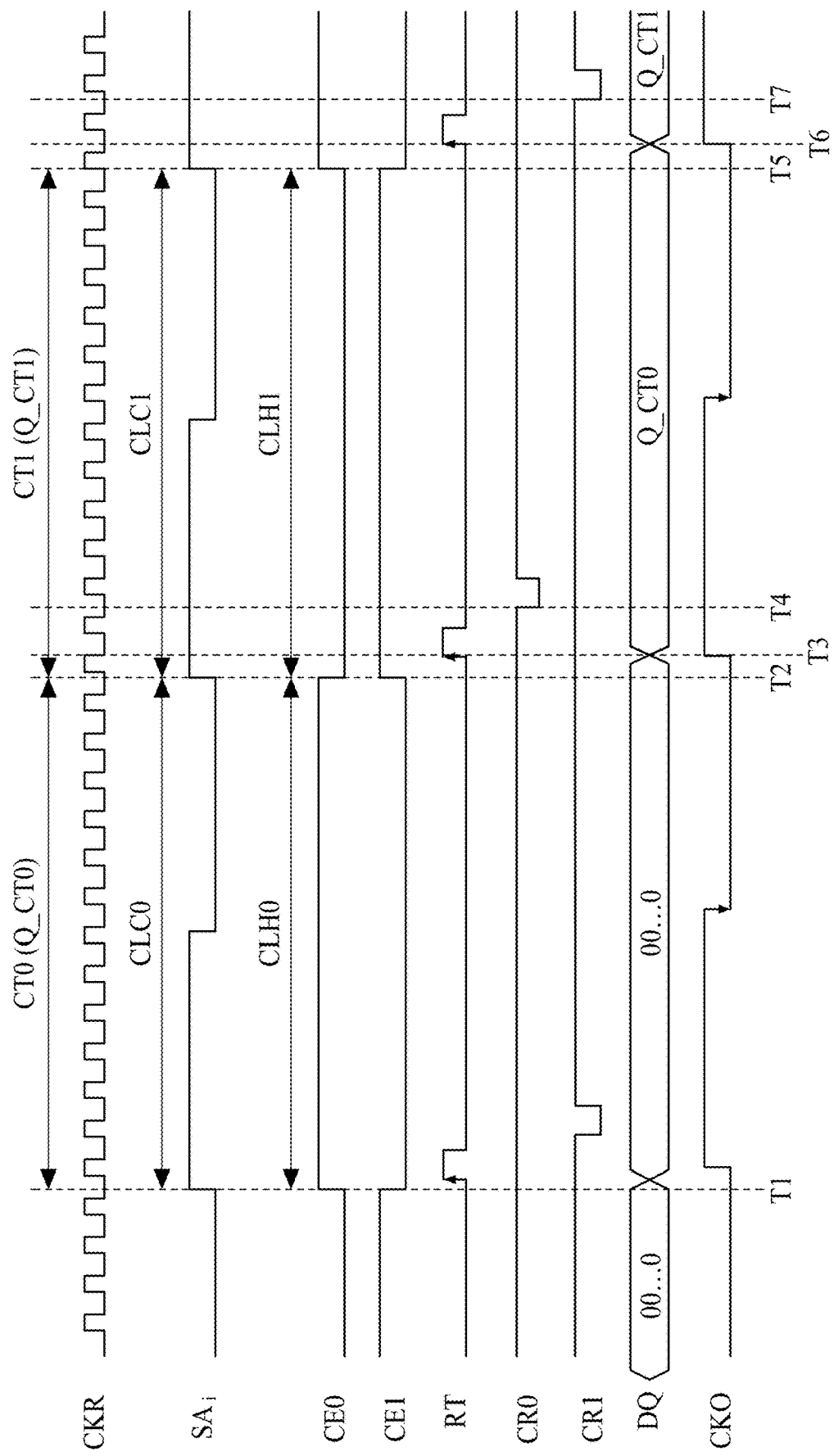
FIG. 5 illustrates waveforms of signals and data involved in the analog-to-digital conversion scheme shown in FIG. 4 in accordance with some embodiments of the present disclosure.

In the present embodiment, two time-interleaved counters may be sufficient to count each cycle time of the output signal SA continuously. FIG. 5 illustrates waveforms of signals and data involved in the ADC scheme shown in FIG. 4 in accordance with some embodiments of the present disclosure. Referring to FIG. 5 and also to FIG. 4, the frequency divider 414 is configured to divide a frequency of the output signal $SA_i$ by a factor of 2 to generate the frequency-divided signal CE0. Hence, a first half of a cycle of the frequency-divided signal CE0, e.g. one of half cycles CLH0 and CLH1, corresponds to an even cycle of the output signal $SA_i$; a second half of the cycle of the frequency-divided signal CE0, e.g. the other of the half cycles CLH0 and CLH1, corresponds to an odd cycle of the output signal $SA_i$.

At time T1, the first counter 415 is enabled by the frequency-divided signal CE0 having a high signal level, and starts to count a number of cycles of the reference clock signal CKR generated during the half cycle CLH0. As the half cycle CLH0 corresponds to a complete cycle CLC0 of the output signal $SA_i$, the number of cycles of the reference clock signal CKR generated during the half cycle CLH0 can represent the duration of the cycle CLC0, i.e. a cycle time CT0 of the output signal $SA_i$.

After the cycle time CT0 has elapsed (e.g. at time T2), the multiplexer 418 may receive the resulting first digital count DC0 having a digital code Q_CT0, and output the digital code Q_CT0 as a digital code within the sequence of digital codes $SD_i$. Additionally, at time T2, the first counter 415 is disabled due to a low signal level of the frequency-divided signal CE0, while the second counter 416 is enabled due to a high signal level of the inverted frequency-divided signal CE1. As a result, the second counter 416 starts to count a number of cycles of the reference clock signal CKR generated during the half cycle CLH1. The number of cycles of the reference clock signal CKR generated during the half cycle CLH1 can represent the duration of the cycle CLC1, i.e. a cycle time CT1 of the output signal $SA_i$.

At time T3, the register 419 is configured to output the digital code Q_CT0 to a data bus DQ. Thereafter, at time T4, the first counter 415 is configured to reset the first digital count DC0 according to a reset signal CR0.

After the cycle time CT1 has elapsed (e.g. at time T5), the multiplexer 418 may receive the resulting second digital count DC1 having a digital code Q_CT1, and output the digital code Q_CT1 as a digital code within the sequence of digital codes $SD_i$. Additionally, at time T5, the first counter 415 is enabled again while the second counter 416 is disabled. As a result, the first counter 415 starts to count a number of cycles of the reference clock signal CKR generated during another half cycle of the frequency-divided signal CE0.

Next, at time T6, the register 419 is configured to output the digital code Q_CT1 to the data bus DQ. At time T7, the second counter 416 is configured to reset the second digital count DC1 according to a reset signal CR1.

Based on the operations described above, the ADC circuit 312_i can utilize time-interleaved counters to generate the sequence of digital codes $SD_i$ including a plurality of digital codes, each digital code being indicative of a cycle time of the output signal $SA_i$. Please note that circuit topology and operations described above are for illustrative purposes only, and are not intended to limit the scope of the present disclosure. In some embodiments, the frequency divider 414 may use a frequency division factor different from two in accordance with design requirements. In some other embodiments, the first counter 415 may be enabled by a trigger signal having a first logic level, while the second counter 416 may be enabled by a trigger signal having a second logic level different from the first logic level. As a result, the inverter 417 can be omitted from the ADC circuit 312_i. In some other embodiments, the register 419 can be omitted such that the multiplexer 418 can directly output the sequence of digital codes SD to the data bus DQ. Those skilled in the art will appreciate that any ADC scheme, capable of converting each cycle time of an analog signal into a sequence of digital codes by counting a number of cycles of a reference clock signal generated during each cycle of the analog signal, is within the contemplated scope of the present disclosure.

Figure 6:
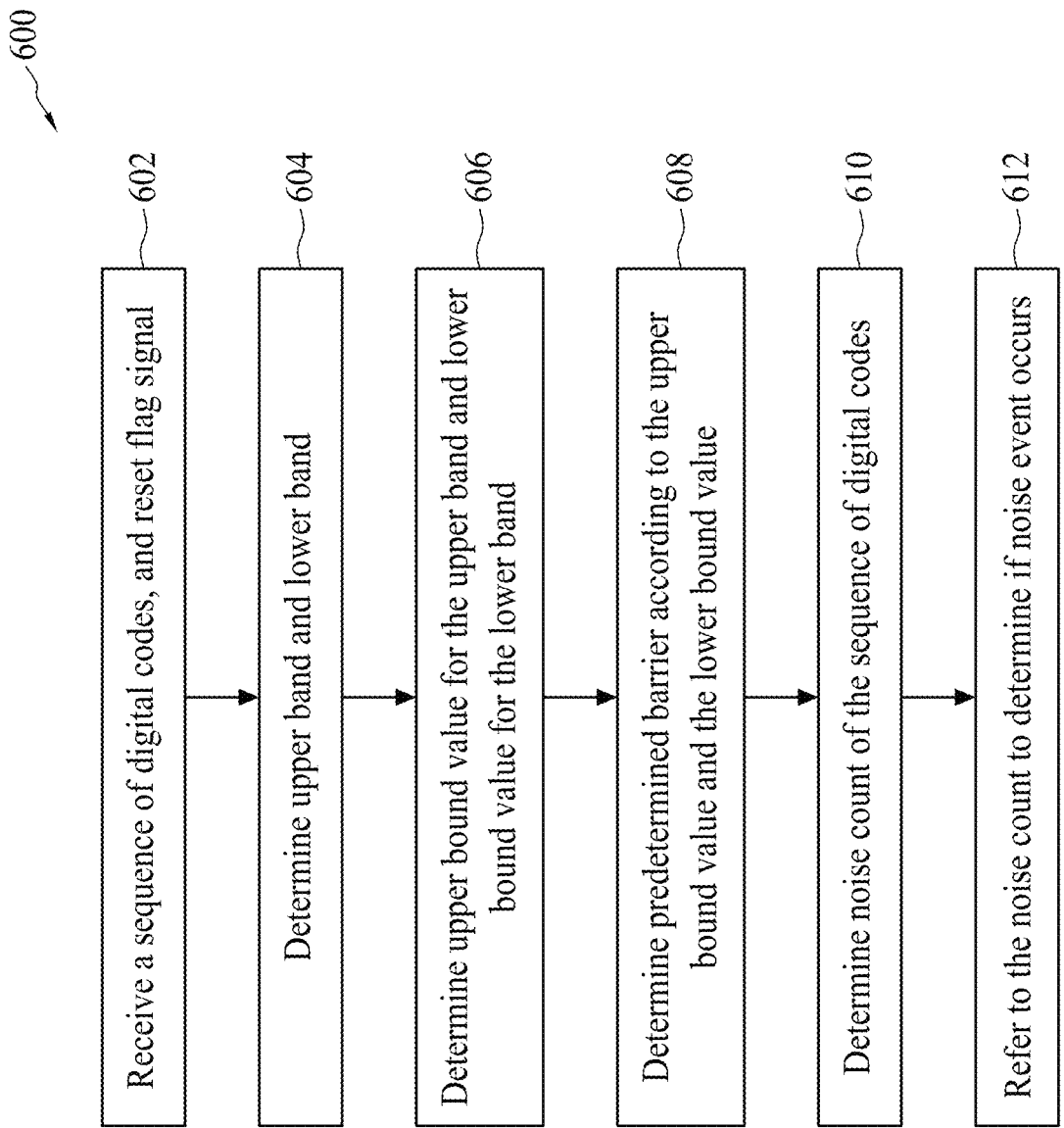
FIG. 6 illustrates a flow chart of an exemplary method for recognizing a noise event in accordance with some embodiments of the present disclosure.
Figure 7:
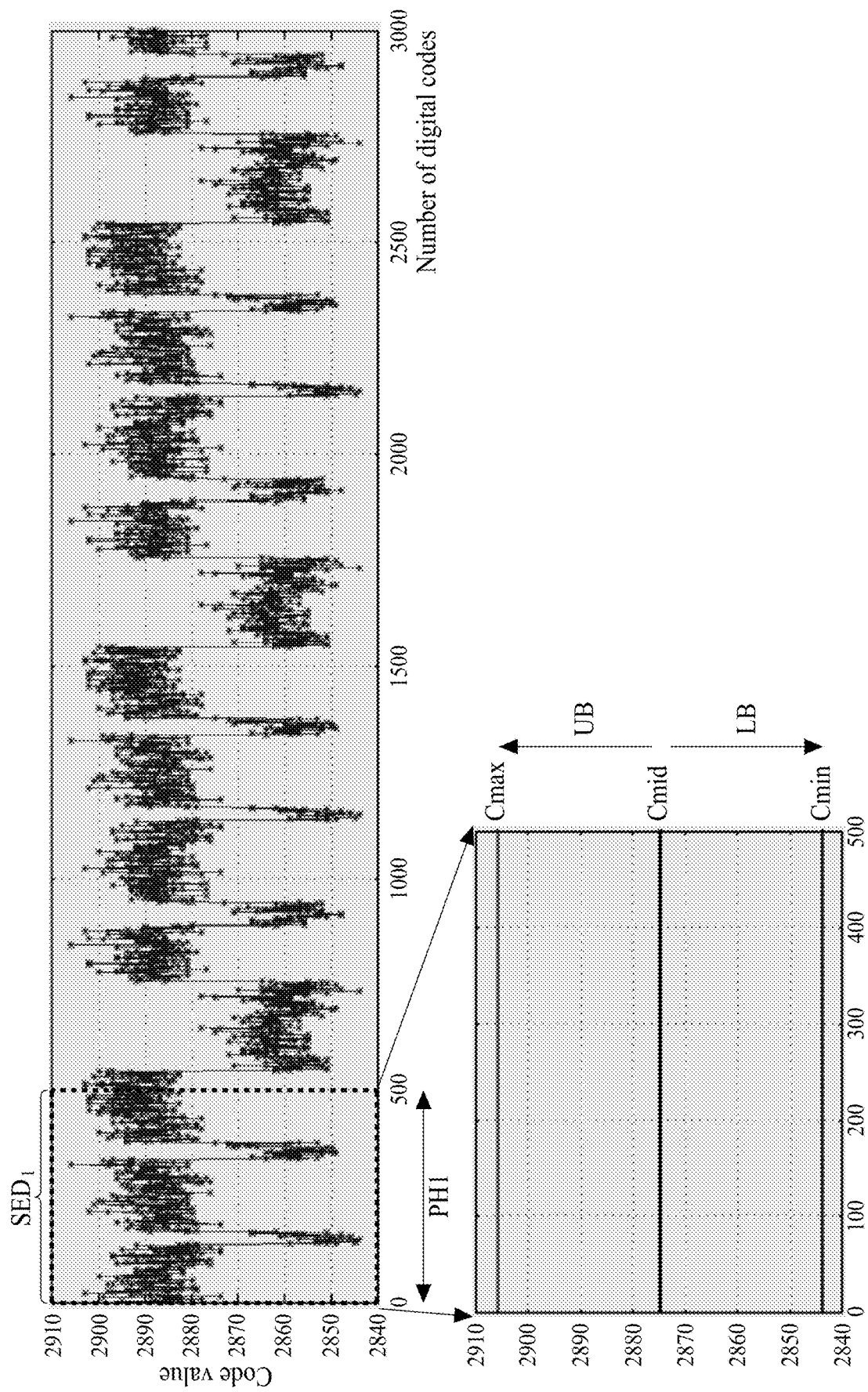
FIGS. 7-9 are diagrams illustrating different phases in noise event recognition in accordance with some embodiments of the present disclosure.
Figure 8:
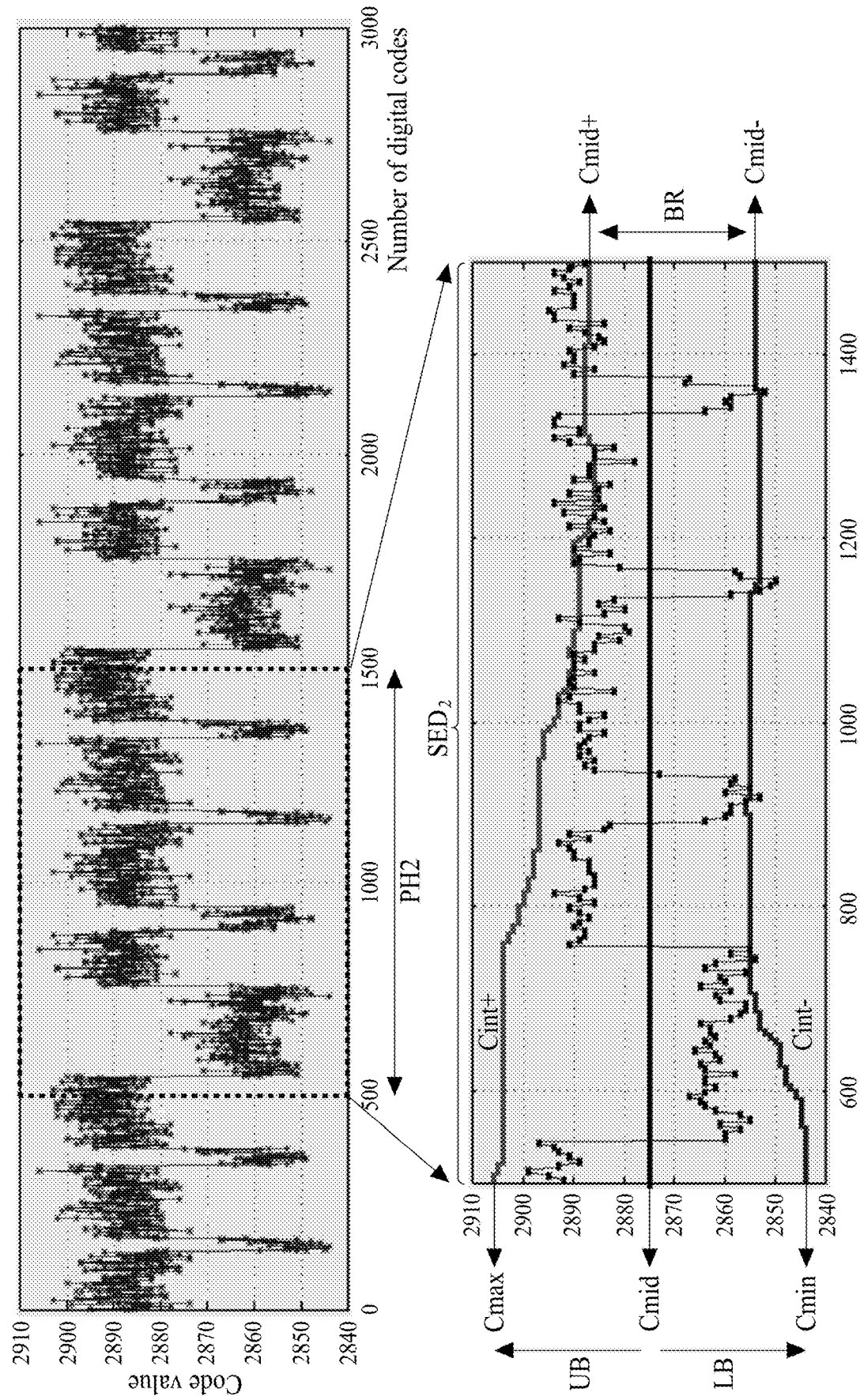
Figure 9:
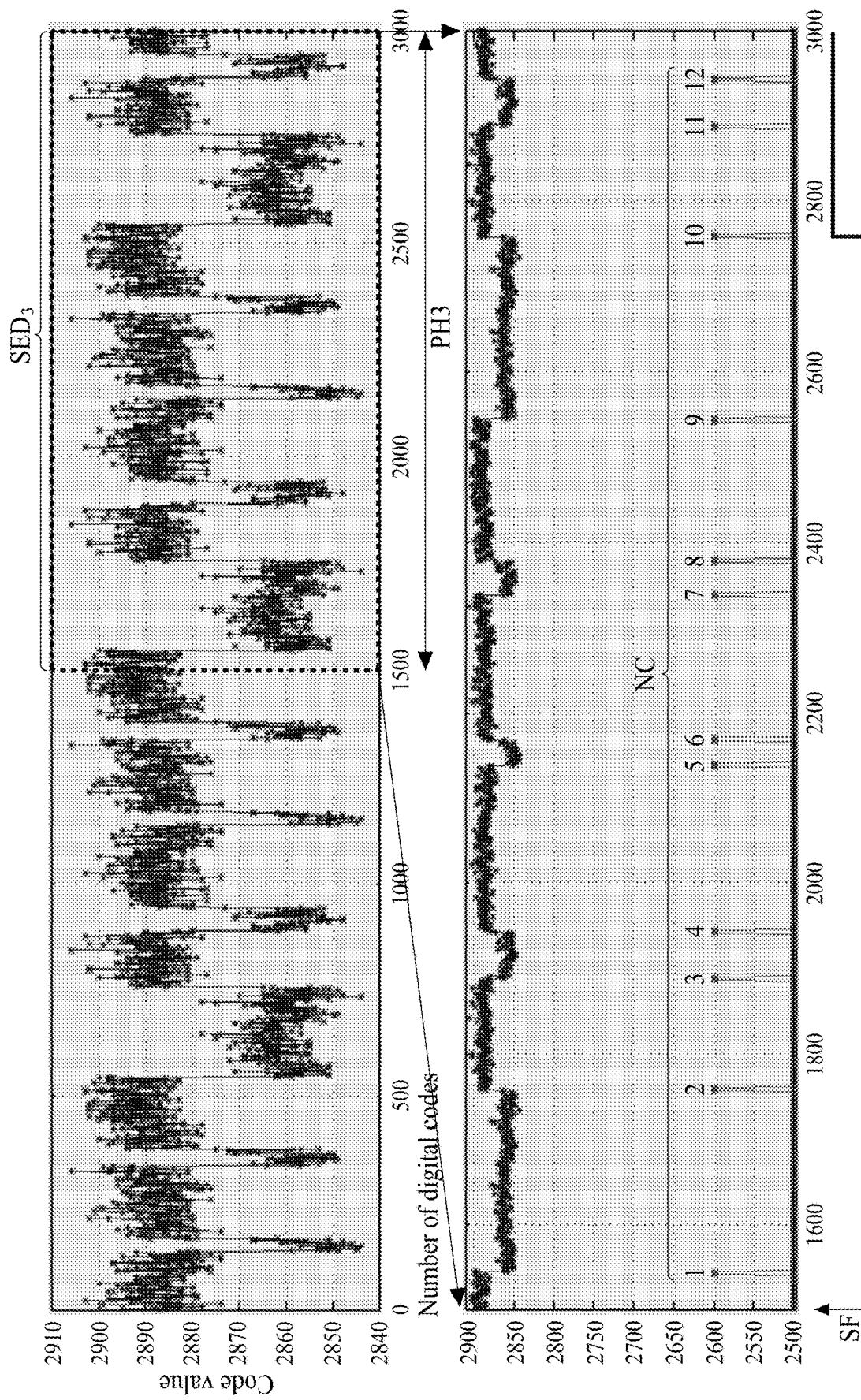

When a sequence of digital codes is generated, a noise event recognition scheme can be used to recognize if the sequence of digital codes is affected by a noise event. FIG. 6 illustrates a flow chart of an exemplary method for recognizing a noise event in accordance with some embodiments of the present disclosure. The method 600 shown in FIG. 6 may be employed in the noise detection circuit 110 shown in FIG. 1, the noise event recognition circuit 232 shown in FIG. 2, and the noise event recognition circuit 332 shown in FIG. 3 to detect if a DUT is affected by a noise event. To facilitate understanding of the present disclosure, the method shown in FIG. 6 is described with reference to the noise event recognition circuit 232 shown in FIG. 2 and also with reference to FIGS. 7-9. FIGS. 7-9 are diagrams illustrating different phases in noise event recognition in accordance with some embodiments of the present disclosure. A sequence of digital codes shown in FIGS. 7-9 can represent an embodiment of the sequence of digital codes SD inputted to the noise event recognition circuit 232 shown in FIG. 2. However, those skilled in the art will appreciate that the sequence of digital codes illustrated in FIGS. 7-9 can represent an embodiment of at least one of the sequences of digital codes $SD_1$-$SD_N$ shown in FIG. 3 without departing from the scope of the present disclosure.

For illustrative purposes, the sequence of digital codes shown in the embodiments shown in FIGS. 7-9 includes a first set of digital codes $SED_1$, a second set of digital codes $SED_2$ and a third set of digital codes $SED_3$, which are produced during different period of times. Additionally, in the embodiments shown in FIGS. 7-9, the horizontal axis represents time in terms of the number of produced digital codes, and the vertical axis represents code values of the produced digital codes, which are expressed in decimals.

At operation 602, the noise event recognition circuit 232 is configured to receive the sequence of digital codes SD and reset the flag signal SF. For example, in an initialization phase PH1 shown in FIG. 7, the noise event recognition circuit 232 can set the flag signal SF to a first signal level, such as a logic low level, to indicate the "PASS" status.

At operation 604, the noise event recognition circuit 232 is configured to determine an upper band and a lower band of code values according to a first set of digital codes produced during a first period of time.

For example, referring to FIG. 7, the noise event recognition circuit 232 is configured to determine a reference value Cmid according to the first set of digital codes $SED_1$ which is produced in the initialization phase PH1. Accordingly, the noise event recognition circuit 232 may determine that a range of code values greater than the reference value Cmid corresponds to an upper band UB, and that a range of code values less than the reference value Cmid corresponds to a lower band LB. For illustrative purposes, the first set of digital codes $SED_1$ may correspond to, but is not limited to, 500 digital codes firstly produced within the sequence of digital codes SD.

In the embodiment shown in FIG. 7, the noise event recognition circuit 232 can set the reference value Cmid to a mean of a maximum code value Cmax and a minimum code value Cmin of the set of digital codes $SED_1$. However, it is worth noting that the reference value Cmid is not limited to be a mean of the maximum code value Cmax and the minimum code value Cmin. In some embodiments, the reference value Cmid can be set to a code value between the maximum code value Cmax and the minimum code value Cmin.

At operation 606, the noise event recognition circuit 232 is configured to determine an upper bound value for the upper band and a lower bound value for the lower band. For example, the noise event recognition circuit 232 may determine the upper bound value according to upper-group digital codes in a second set of digital codes produced during a second period of time after the first period of time, where each upper-group digital code has a code value falling within the upper bound. Also, the noise event recognition circuit 232 may determine the lower bound value according to lower-group digital codes in the second set of digital codes, where each lower-group digital code has a code value falling within the lower bound.

For example, referring to FIG. 8, the noise event recognition circuit 232 may select one out of every predetermined number of successive digital codes produced in a barrier derivation phase PH2. Each selected digital code is used as a digital code in the second set of digital codes $SED_2$. For illustrative purposes, the barrier derivation phase PH2 may correspond to a period of time during which the 501th to 1500th digital codes are produced. The noise event recognition circuit 232 can be configured to select one out of every five successive digital codes produced in the barrier derivation phase PH2. As a result, the second set of digital codes $SED_2$ corresponds to 200 digital codes in the present embodiment.

It is worth noting that the noise event recognition circuit 232 can perform median filtering on digital codes produced in the barrier derivation phase PH2 to reduce the impact of certain noise, such as thermal noise and flicker noise. Accordingly, each digital code in the second set of digital codes $SED_2$ may have a median code value of a predetermined number of successive digital codes where the digital code is selected from.

Each time a digital code (e.g. an upper-group digital code) in the second set of digital codes SED2 having a code value falling within the upper band UB is obtained, the noise event recognition circuit 232 can update an intermediate value Cint+ by comparing the intermediate value Cint+ with the code value of the digital code. By way of example but not limitation, when the intermediate value Cint+ is less than the code value of the digital code, the noise event recognition circuit 232 can increase the intermediate value Cint+ by a predetermined amount such as 1. When the intermediate value Cint+ is greater than the code value of the digital code, the noise event recognition circuit 232 can decrease the intermediate value Cint+ by the predetermined amount. In some embodiments, the intermediate value Cint+ may converge after one or more updates on the intermediate value Cint+.

When the barriers derivation phase PH2 ends, the noise event recognition circuit 232 is configured to use the intermediate value Cint+, which may have been updated one or more times in the barriers derivation phase PH2, as an upper bound value Cmid+ for the upper band UB.

In the present embodiment, before updating the intermediate value Cint+ according to the second set of digital codes $SED_2$, the noise event recognition circuit 232 may set the intermediate value Cint+ to the maximum code value Cmax of the set of digital codes $SED_1$. However, those skilled in the art will appreciate that the intermediate value Cint+ can be set to another value greater than the reference value Cmid before updated according to the second set of digital codes $SED_2$ without departing from the scope of the present disclosure.

Similarly, each time a digital code (e.g. a lower-group digital code) in the second set of digital codes SED2 having a code value falling within the lower band LB is obtained, the noise event recognition circuit 232 can update an intermediate value Cint− by comparing the intermediate value Cint− with the code value of the digital code. By way of example but not limitation, when the intermediate value Cint− is less than the code value of the digital code, the noise event recognition circuit 232 can increase the intermediate value Cint− by a predetermined amount such as 1. When the intermediate value Cint− is greater than the code value of the digital code, the noise event recognition circuit 232 can decrease the intermediate value Cint− by the predetermined amount. In some embodiments, the intermediate value Cint− may converge after one or more updates on the intermediate value Cint−.

When the barriers derivation phase PH2 ends, the noise event recognition circuit 232 is configured to use the intermediate value Cint−, which may have been updated one or more times in the barriers derivation phase PH2, as a lower bound value Cmid− for the lower band LB.

In the present embodiment, before updating the intermediate value Cint− according to the second set of digital codes $SED_2$, the noise event recognition circuit 232 may set the intermediate value Cint− to the minimum code value Cmin of the set of digital codes $SED_1$. However, those skilled in the art will appreciate that the intermediate value Cint− can be set to another value less than the reference value Cmid before updated according to the second set of digital codes $SED_2$ without departing from the scope of the present disclosure.

At operation 608, the noise event recognition circuit 232 is configured to determine a predetermined value, or a predetermined barrier, according to the upper bound value and the lower bound value. In some embodiments, the predetermined value may be a function of the upper bound value and the lower bound value.

For example, in the embodiment shown in FIG. 8, the noise event recognition circuit 232 may determine a predetermined value BR according to the difference between the upper bound value Cmid+ and the lower bound value Cmid−. The noise event recognition circuit 232 can multiply a difference between the upper bound value Cmid+ and the lower bound value Cmid− by a scaling factor such as 0.8 to obtain the predetermined value BR. In some embodiments, the scaling factor can be any suitable value. In some other embodiments, the noise event recognition circuit 232 can directly set the predetermined value BR to the difference between the upper bound value Cmid+ and the lower bound value Cmid−.

At operation 610, the noise event recognition circuit 232 is configured to determine the noise count NC of the sequence of digital codes SD. The noise count NC is indicative of a number of times a change in code values between two successive digital codes exceeds the predetermined value. In some embodiments, when a change in code values between two successive digital codes exceeds the predetermined value, the noise event recognition circuit 232 can increase the noise count NC by a predetermined amount.

For example, in the embodiment shown in FIG. 9, the noise event recognition circuit 232 may set the flag signal SF to a predetermined signal level such as a logic low level, and start to determine the noise count NC of the third set of digital codes $SED_3$ in a counting phase PH3. Each time a change in code values between two successive digital codes in the third set of digital codes $SED_3$ exceeds the predetermined value BR shown in FIG. 8, the noise event recognition circuit 232 can increase the noise count NC by one. In the present embodiment, the noise count NC is equal to 12 when the 3000th digital code is produced. This means that a change in code values between two successive digital codes exceeds the predetermined value BR, or a predetermined barrier, twelve times in the counting phase PH3.

At operation 612, the noise event recognition circuit 232 is configured to refer to the noise count NC to determine if a noise event occurs. In some embodiments, when the noise count NC is greater than or equal to a predetermined threshold, the noise event recognition circuit 232 can set the flag signal SF to a second signal level, such as a logic high level, to indicate that the occurrence of the noise event.

For example, in the embodiment shown in FIG. 9, the noise event recognition circuit 232 is configured to determine if the noise count NC is greater than or equal to 10. As the noise count NC increase to 10 before the counting phase PH3 ends, the noise event recognition circuit 232 can set the flag signal SF to a logic high level to indicate the "FAIL" status.

With the use of a noise count which is indicative of a number of times a change in code values between two successive digital codes exceeds a predetermined barrier, a noise event recognition scheme can be utilized in testing a DUT to rapidly identify the occurrence of a noise event such as an RTN event. In some embodiments, the noise event recognition scheme can refer to the noise count to control a supply power of the DUT to thereby improve yield and circuit performance.

Figure 10:
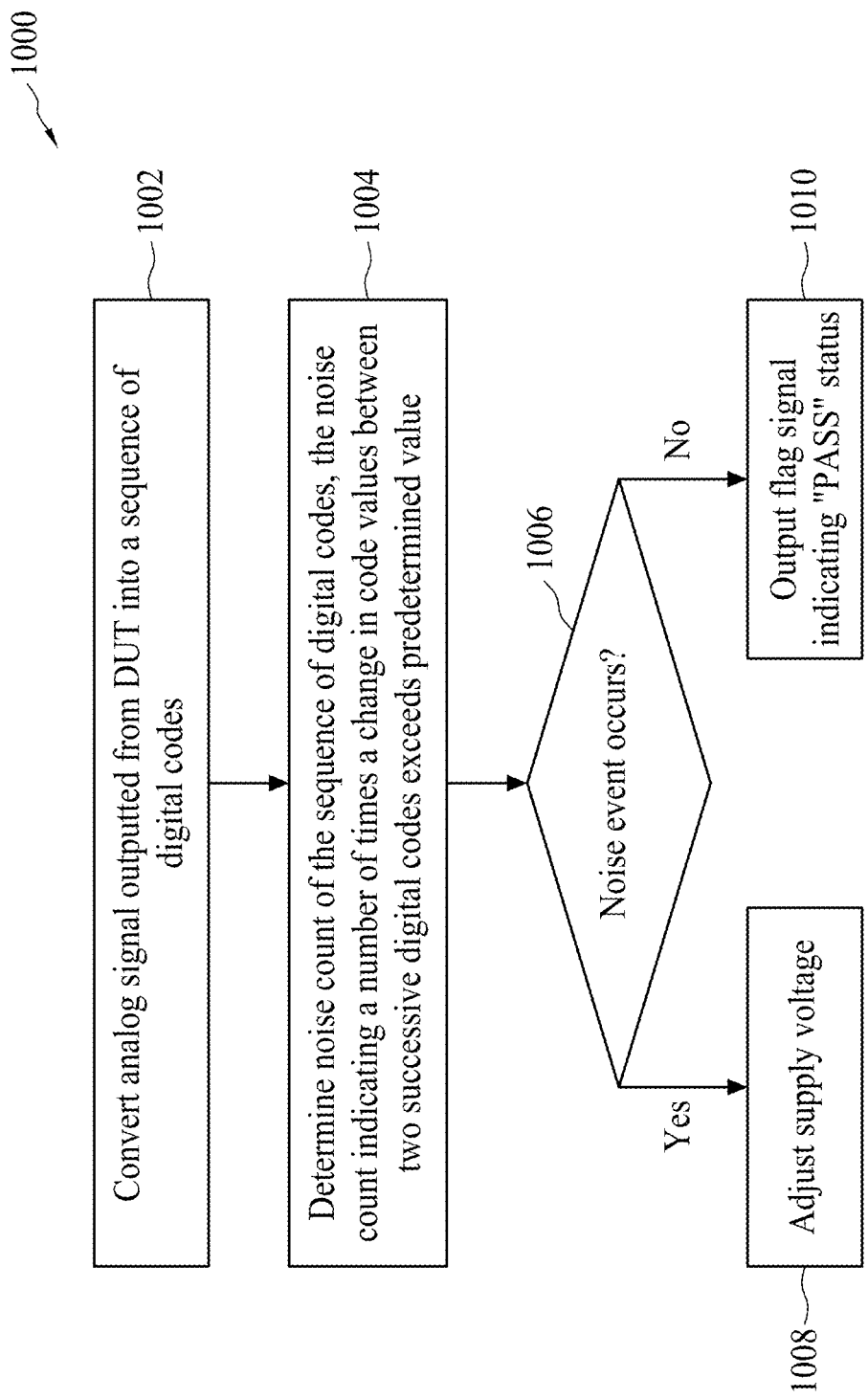
FIG. 10 illustrates a flow chart of an exemplary method for testing a device under test in accordance with some embodiments of the present disclosure.

FIG. 10 illustrates a flow chart of an exemplary method for testing a device under test (DUT) in accordance with some embodiments of the present disclosure. The method 1000 shown in FIG. 10 may be employed in at least one of the noise detection circuit 110 shown in FIG. 1, the noise e detection circuit 210 shown in FIG. 2, and the noise detection circuit 310 shown in FIG. 3 to detect if a DUT is affected by a noise event, thereby controlling a supply power of the DUT to improve yield and circuit performance. For illustrative purposes, the method shown in FIG. 10 is described below with reference to the noise detection circuit 210 shown in FIG. 2 and the sequence of digital codes SD shown in FIGS. 7-9. In some embodiments, other operations in the method 1000 can be performed. In some embodiments, operations of the method 1000 can be performed in a different order and/or vary.

At operation 1002, an analog signal outputted from a DUT is converted into a sequence of digital codes, wherein the DUT outputs the analog signal according to a supply voltage. For example, in the embodiment shown in FIG. 2, the DUT 102 can output an analog signal, i.e. the output signal SA, according to the supply voltage VS. The ADC 212 is configured to convert the output signal SA into the sequence of digital codes SD.

At operation 1004, a noise count of the sequence of digital codes is determined, wherein the noise count indicates a number of times a change in code values between two successive digital codes exceeds a predetermined value. For example, in the embodiment shown in FIG. 2, the noise event recognition circuit 232 is configured to determine the noise count NC of the sequence of digital codes SD, wherein the noise count NC can indicate a number of times a change in code values between two successive digital codes exceeds a predetermined barrier, such as the predetermined value BR shown in FIG. 8.

In some embodiments, the predetermined value adopted by operation 1004 can be determined according to an upper bound value and a lower bound value. For example, in the embodiment shown in FIG. 2, the sequence of digital codes SD includes a first set of digital codes produced during a first period of time, and a second set of digital codes being produced during a second period of time after the first period of time. The noise event recognition circuit 232 is configured to determine a reference value, such as the reference value Cmid shown in FIG. 7, according to the first set of digital codes.

Next, the noise event recognition circuit 232 is configured to determine an upper bound value, such as the upper bound Cmid+ shown in FIG. 8, according to upper-group digital codes in the second set of digital codes. Each of the upper-group digital codes has a code value greater than the reference value. By way of example but not limitation, the noise event recognition circuit 232 can set an intermediate value greater than the reference value, e.g. the intermediate value Cint+ shown in FIG. 8. During the second period of time, the noise event recognition circuit 232 can update the intermediate value by comparing the intermediate value with a code value of each upper-group digital code each time the upper-group digital code is produced. When the second period of time has elapsed, the noise event recognition circuit 232 can use the intermediate value as the upper bound value.

Similarly, the noise event recognition circuit 232 is configured to determine a lower bound value, such as the lower bound Cmid− shown in FIG. 8, according to lower-group digital codes in the second set of digital codes. Each of the lower-group digital codes has a code value less than the reference value. By way of example but not limitation, the noise event recognition circuit 232 can set an intermediate value less than the reference value, e.g. the intermediate value Cint− shown in FIG. 8. During the second period of time, the noise event recognition circuit 232 can update the intermediate value by comparing the intermediate value with a code value of each lower-group digital code each time the lower-group digital code is produced. When the second period of time has elapsed, the noise event recognition circuit 232 can use the intermediate value as the lower bound value.

Thereafter, the noise event recognition circuit 232 can determine the predetermined value according to the upper bound value and the lower bound value, such as the predetermined value BR shown in FIG. 8.

At operation 1006, the noise count is used to determine if a noise event occurs in the DUT. If it is determined that the noise event occurs, the method 1000 proceeds to operation 1008; otherwise, the method 1000 proceeds to operation 1010. For example, in the embodiment shown in FIG. 2, the noise event recognition circuit 232 is configured to refer to the noise count NC to determine if a noise event, e.g. an RTN event, occurs in the DUT 102. When the noise event NC is greater than or equal to a predetermined threshold, it is determined that the noise event occurs in the DUT 102.

At operation 1008, the supply voltage of the DUT is adjusted to a predetermined voltage level or a suitable voltage level. For example, in the embodiment shown in FIG. 2, the noise event recognition circuit 232 can increase the supply voltage VS by a predetermined amount. In some embodiments, the noise event recognition circuit 232 can refer to the noise event NC to determine an increase in the supply voltage VS.

At operation 1010, a flag signal indicating the "PASS" status is outputted since no noise event is detected. For example, in the embodiment shown in FIG. 2, the noise event recognition circuit 232 can set the flag signal SF to a predetermined signal level to indicate that the DUT 102 meets the product specifications.

By detecting if a number of times a change in code values between two successive digital codes exceeds a predetermined barrier, a noise detection scheme can be utilized in testing a DUT to rapidly identify the occurrence of a noise event such as an RTN event. In some embodiments, the noise detection scheme can determine the predetermined barrier according to a converged upper bound value and a converged bound value, which are obtained by repeatedly comparing a reference value with sample values of incoming codes. In some embodiments, the noise detection scheme can perform median filtering on sample values to filter out noise having high frequency and large amplitude variations. In some embodiments, the noise detection scheme can refer to the noise detection result to adjust a supply voltage of a DUT, thereby improving yield and circuit performance.

Some embodiments described herein may include a noise detection circuit that includes an analog-to-digital conversion (ADC) circuit and a noise event recognition circuit. The ADC circuit is configured to convert an analog signal outputted from a device under test (DUT) into a sequence of digital codes. The noise event recognition circuit, coupled to the ADC circuit, is configured to determine a noise count of the sequence of digital codes. The noise event recognition circuit is also configured to refer to the noise count to determine if a noise event occurs in the DUT. The noise count indicates a number of times a change in code values between two successive digital codes exceeds a predetermined value.

Some embodiments described herein may include a system for controlling a supply voltage of a device under test (DUT). The system includes a noise detection circuit and a voltage regulation circuit. The noise detection circuit, coupled to the DUT, is configured to sample an output signal of the DUT to generate a sequence of sample values of the output signal. Also, the noise detection circuit is configured to determine a noise count of the sequence of sample values, and refer to the noise count to generate a control signal. The noise count indicates a number of times a difference between two successive sample values exceeds a predetermined value. The DUT outputs the output signal according to the supply voltage. The voltage regulation circuit, coupled to the DUT and the noise detection circuit, is configured to selectively adjust the supply voltage according to the control signal.

Some embodiments described herein may include a method for testing a device under test (DUT). The method includes converting an analog signal outputted from the DUT into a sequence of digital codes. The DUT outputs the analog signal according to a supply voltage. The method further includes determining a noise count of the sequence of digital codes. The noise count indicates a number of times a change in code values between two successive digital codes exceeds a predetermined value. The method further includes referring to the noise count to determine if a noise event occurs in the DUT. When it is determined that the noise event occurs in the DUT, the method further includes adjusting the supply voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A noise detection circuit, comprising:
   an analog-to-digital conversion (ADC) circuit, configured to convert an analog signal outputted from a device under test (DUT) into a sequence of digital codes; and
   a noise event recognition circuit, coupled to the ADC circuit, the noise event recognition circuit configured to determine a noise count of the sequence of digital codes, and refer to the noise count to determine if a noise event occurs in the DUT, the noise count indicating a number of times a change in code values between two successive digital codes exceeds a predetermined value.

2. The noise detection circuit of claim 1, wherein when the noise count is greater than or equal to a predetermined threshold, the noise event recognition circuit is configured to generate a flag signal indicating that the noise event occurs in the DUT.

3. The noise detection circuit of claim 1, wherein the noise event is a random telegraph noise (RTN) event.

4. The noise detection circuit of claim 1, wherein the ADC circuit is configured to receive a reference clock signal, and count a number of cycles of the reference clock signal generated during each cycle of the analog signal to generate the sequence of digital codes.

5. The noise detection circuit of claim 4, wherein the ADC circuit comprises:
a frequency divider, configured to perform frequency division upon the analog signal to generate a frequency-divided signal; and
a first counter, coupled to the frequency divider, the first counter configured to count a number of cycles of the reference clock signal generated during a first portion of each cycle of the frequency-divided signal to generate a first digital count;
a second counter, coupled to the frequency divider, the second counter configured to count a number of cycles of the reference clock signal generated during a second portion of each cycle of the frequency-divided signal to generate a second digital count; and
a multiplexer, coupled to the first counter and the second counter, the multiplexer configured to, in response to the frequency-divided signal, select output one of the first digital count and the second digital count to provide the sequence of digital codes.

6. The noise detection circuit of claim 1, wherein the sequence of digital codes comprises a first set of digital codes produced during a first period of time, and a second set of digital codes produced during a second period of time after the first period of time; the noise event recognition circuit is configured to determine a reference value according to the first set of digital codes, determine an upper bound value according to upper-group digital codes in the second set of digital codes each having a code value greater than the reference value, determine a lower bound value according to lower-group digital codes in the second set of digital codes each having a code value less than the reference value, and determine the predetermined value according to the upper bound value and the lower bound value.

7. The noise detection circuit of claim 6, wherein the noise event recognition circuit is configured to set the reference value to a mean of a maximum code value and a minimum code value of the first set of digital codes.

8. The noise detection circuit of claim 6, wherein the noise event recognition circuit is configured to select, as a digital code in the second set of digital codes, a digital code from every predetermined number of successive digital codes produced in the second period of time, the selected digital code having a median code value of respective code values of the predetermined number of digital codes.

9. The noise detection circuit of claim 6, wherein the noise event recognition circuit is configured to determine the predetermined value according to a difference between the upper bound value and the lower bound value.

10. A system for controlling a supply voltage of a device under test (DUT), comprising:
a noise detection circuit, coupled to the DUT, the noise detection circuit configured to sample an output signal of the DUT to generate a sequence of sample values of the output signal, determine a noise count of the sequence of sample values, and refer to the noise count to generate a control signal, the noise count indicating a number of times a difference between two successive sample values exceeds a predetermined value, the DUT outputting the output signal according to the supply voltage; and
a voltage regulation circuit, coupled to the DUT and the noise detection circuit, the voltage regulation circuit configured to selectively adjust the supply voltage according to the control signal.

11. The system of claim 10, wherein when the noise count is greater than or equal to a predetermined threshold, the voltage regulation circuit is configured to increase the supply voltage according to the control signal generated by the noise detection circuit.

12. The system of claim 11, wherein the noise detection circuit is disposed on a die where the DUT is disposed.

13. A method for testing a device under test (DUT), comprising:
converting an analog signal outputted from the DUT into a sequence of digital codes, wherein the DUT outputs the analog signal according to a supply voltage;
determining a noise count of the sequence of digital codes, the noise count indicating a number of times a change in code values between two successive digital codes exceeds a predetermined value;
referring to the noise count to determine if a noise event occurs in the DUT; and
when it is determined that the noise event occurs in the DUT, adjusting the supply voltage.

14. The method of claim 13, further comprising:
determining a reference value according to a first set of digital codes within the sequence of digital codes, the first set of digital codes being produced during a first period of time;
determining an upper bound value according to upper-group digital codes in a second set of digital codes within the sequence of digital codes, the second set of digital codes being produced during a second period of time after the first period of time, each of the upper-group digital codes having a code value greater than the reference value;
determining a lower bound value according to lower-group digital codes in the second set of digital codes, each of the lower-group digital codes having a code value less than the reference value; and
determining the predetermined value according to the upper bound value and the lower bound value.

15. The method of claim 14, wherein determining the upper bound value according to the upper-group digital codes in the second set of digital codes comprises:
setting an intermediate value greater than the reference value;
during the second period of time, updating the intermediate value by comparing the intermediate value with a code value of each upper-group digital code each time the upper-group digital code is produced; and
using the intermediate value as the upper bound value when the second period of time has elapsed.

16. The method of claim 15, wherein setting the intermediate value comprises:
setting the intermediate value to a maximum code value of the first set of digital codes.

17. The method of claim 15, wherein updating the intermediate value comprises:
when the intermediate value is less than the code value of the upper-group digital code, increasing the intermediate value by a predetermined amount; and
when the intermediate value is greater than the code value of the upper-group digital code, decreasing the intermediate value by the predetermined amount.

18. The method of claim 14, wherein determining the lower bound value according to the lower-group digital codes in the second set of digital codes comprises:
- setting an intermediate value less than the reference value;
- during the second period of time, updating the intermediate value by comparing the intermediate value with a code value of each lower-group digital code each time the lower-group digital code is produced; and
- using the intermediate value as the lower bound value when the second period of time has elapsed.

19. The method of claim 18, wherein setting the intermediate value comprises:
- setting the intermediate value to a minimum of code values of the first set of digital codes.

20. The method of claim 18, wherein updating the intermediate value comprises:
- when the intermediate value is less than the code value of the lower-group digital code, increasing the intermediate value by a predetermined amount; and
- when the intermediate value is greater than the code value of the lower-group digital code, decreasing the intermediate value by the predetermined amount.

\* \* \* \* \*